US006426627B2

(12) United States Patent
Kikukawa et al.

(10) Patent No.: US 6,426,627 B2
(45) Date of Patent: Jul. 30, 2002

(54) VACUUM SWITCH INCLUDING VACUUM-MEASUREMENT DEVICES, SWITCHGEAR USING THE VACUUM SWITCH, AND OPERATION METHOD THEREOF

(75) Inventors: Shuuichi Kikukawa; Katsunori Kojima; Tooru Tanimizu; Ayumu Morita, all of Hitachi; Masashige Tsuji, Narashino, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/732,737

(22) Filed: Dec. 11, 2000

(30) Foreign Application Priority Data

Dec. 16, 1999 (JP) .......................................... 11-356974

(51) Int. Cl.[7] ....................... G01R 31/327; G01L 21/30; H01H 33/66; H01H 33/02

(52) U.S. Cl. ......................... 324/424; 324/460; 218/10; 218/12; 218/122; 218/155

(58) Field of Search ................................ 324/424, 460, 324/464; 218/10, 12, 13, 14, 41, 45, 118, 122, 153, 155

(56) References Cited

U.S. PATENT DOCUMENTS

| | | | | | |
|---|---|---|---|---|---|
| 4,163,130 | A | * | 7/1979 | Kubota et al. | 324/464 |
| 5,537,858 | A | | 7/1996 | Bauer | |
| 5,739,419 | A | | 4/1998 | Maier et al. | |
| 6,054,862 | A | * | 4/2000 | Zhou | 324/464 |
| 6,153,846 | A | * | 11/2000 | Morita et al. | 218/122 |
| 6,268,579 | B1 | * | 7/2001 | Kajiwara et al. | 218/153 |

FOREIGN PATENT DOCUMENTS

| | | |
|---|---|---|
| JP | 55-45160 | 3/1980 |
| JP | 56-36818 | 4/1981 |
| JP | 8-306279 | 11/1996 |

* cited by examiner

*Primary Examiner*—N. Le
*Assistant Examiner*—Anjan K. Deb
(74) *Attorney, Agent, or Firm*—Mattingly, Stanger & Malur, P.C.

(57) ABSTRACT

A vacuum switch is composed by installing a vacuum circuit-breaker and a disconnector in different grounded vacuum vessels, respectively, and a vacuum-measurement device is attached to each grounded vacuum vessel. The above vacuum vessel communicates with one of the grounded vacuum vessels, and the degree of vacuum in the vacuum vessel can be directly measured and monitored.

5 Claims, 3 Drawing Sheets

VACUUM SWITCH INCLUDING VACUUM-MEASUREMENT DEVICES, SWITCHGEAR USING THE VACUUM SWITCH, AND OPERATION METHOD THEREOF

BACKGROUND OF THE INVENTION

The present invention relates to a vacuum switch including vacuum-measurement devices, switchgear using the vacuum switch, and an operation method thereof.

The break performance and the withstand-voltage performance of a vacuum switchgear rapidly deteriorate when the degree of vacuum decreases to below $10^{-4}$ Torr. Changes in the degree of vacuum are caused by leakage-in of gas from cracks which have chapped, discharge of gas molecules which have been absorbed in metal and insulation members composing a vacuum vessel, penetration of ambient gas, etc. As the size of a vacuum vessel is increased in accordance with an increase of the applied voltage, it becomes unable to disregard the penetration of ambient gas into the vacuum vessel. It is well known that the degree of vacuum in a vacuum circuit-breaker is monitored by various means. For example, such monitoring methods or apparatuses are disclosed in U.S. Pat. No. 5,537,858, U.S. Pat. No. 5,739,419, U.S. Pat. No. 4,163,130, Japanese Utility Model Application Laid-Open Sho.55-45160, Japanese Patent Application Laid-Open Sho.56-36818, Japanese Patent Application Laid-Open Hei.8-306279, etc. In the contact-type measurement method such as that disclosed in U.S. Pat. No. 4,163,130, of measuring the degree of vacuum in a vacuum vessel which is not grounded, in order to elevate the voltage of a vacuum-measurement device, which is equal to the voltage of a main circuit, from the ground voltage, a transformer is necessary, and has not come into practical use yet.

Further, although the non-contact-type vacuum-measurement methods for a vacuum vessel are devised in U.S. Pat. No. 5,537,858, Hei.8-306279, etc., a method of measuring changes in the degree of vacuum in a vacuum vessel with the required accuracy has not become known yet. In Japanese Utility Model Application Laid-Open Sho.55-45160, although it is not described that the vacuum vessel is grounded, the system in which a vacuum-measurement device attached to a second vacuum vessel containing a first vacuum vessel is disclosed. Further, it is described in this Japanese Utility Model Application Laid-Open, that a vacuum pump beside a vacuum-measurement device is connected to the second vacuum vessel. However, since the first vacuum vessel does not communicate with the second vacuum vessel, the degree of vacuum in the first vacuum vessel cannot be directly measured.

If a vacuum sensor is separated from a main circuit by using an insulation member, the size of the vacuum sensor, including the insulation member, is mostly as large as a vacuum valve. Further, there is a problem in that since electrons generated in the sensor, then generate secondary electrons while colliding with the insulation member, that is, they cause electron multiplication, and these electrons further enter the vacuum valve, the insulation characteristics of the vacuum valve deteriorates. By setting the potential of a line connected to a power source equal to that of an outer cylindrical electrode of the vacuum sensor element, and applying the voltage, divided by a capacitor, to an inner cylindrical electrode, it is possible to remove the insulation member, which in turn downsizes the vacuum sensor. However, the size of a vacuum measurement device becomes large in the last results because insulation of the capacitor from the earth is necessary, and the vacuum measurement device is apt to receive influences of changes in the voltage of the main circuit (for example, surge voltage). Further, since the potential of the vacuum sensor element is equal to that of the line connected to the power source, an insulation transformer or a light transmission line is necessary to transmit a signal to a measurement unit, an alarm lamp, a relay for generating an alarm, etc., and this makes the measurement system complicated.

SUMMARY OF THE INVENTION

An objective of the present invention is to provide a vacuum switch and a vacuum switchgear using the vacuum switch, in which the vacuum switch is downsized, and its degree of vacuum can be measured and monitored reliably, by putting a vacuum circuit-breaker and a disconnector into different grounded vacuum vessels, respectively, by providing a vacuum measurement device at each grounded vessel; and its reliability is improved by composing the vacuum switchgear so that, even if a defect or a malfunction occurs in the vacuum circuit-breaker and the disconnector, its effects do not propagate in the whole of the vacuum switch.

To achieve the above objective, the present invention provides a vacuum switch comprising: grounded vacuum vessels in which a vacuum circuit-breaker portion and a disconnector portion are contained respectively; and vacuum-measurement devices which are attached to the grounded vacuum vessels, respectively.

In the present invention, the vacuum circuit-breaker portion includes indispensable components composing this circuit breaker, that is: movable and fixed electrodes, conductors supporting these electrodes, and a vessel containing these components. Further, the disconnector portion is an apparatus, connected to the circuit-breaker, for maintaining the circuit-breaker in a disconnection state when it is required, and it sometimes includes a grounding switch. Furthermore, it includes a vessel containing these components.

Further, it is desirable in order to assure the safety of workers who inspect and maintain loads or a switchgear, to provide a function for checking or continuously monitoring the degree of vacuum in an operation unit, at a structure of a switchgear according to the present invention, in which a circuit-breaker, a disconnector, and a grounding switch are integrated in a vacuum vessel. As a vacuum valve including a vacuum-measurement device, a vacuum valve using an ionization vacuum gauge, a detector to detect the degree of vacuum by applying voltage to a small gap provided in a vacuum vessel to cause discharge in the gap, or a magnetron-type vacuum-sensing element, are well known. Although all the above well-known detectors can be used in the present invention, it is favorable to use an ionization vacuum gauge or a magnetron-type vacuum-sensing element from the view point of reliability and accuracy. Also, it is possible to adopt the composition in which a megger is connected to a measurement element, although this composition is not suitable for continuous monitoring of the degree of vacuum. By using this composition, the degree of vacuum can be measured without a specific power source.

In the vacuum switch of the present invention, a fixed electrode and a movable electrode are arranged opposite to each other in the vacuum vessel from which these electrodes are insulated with insulation members, and a first vacuum vessel surrounding this vacuum vessel is provided. Further, a vacuum-measurement device is attached to the first vacuum vessel. Further, it is possible that when the degree of vacuum is measured, a set of coaxial electrodes and a magnetic field-generation unit surrounding the coaxial electrodes is attached to the first vacuum vessel which is grounded and in which the fixed electrode and the movable electrode are arranged opposite to each other; and when the degree of vacuum is not measured, the set is detached from the first vacuum vessel. Furthermore, it is desirable to provide a vacuum pump at the grounded vacuum vessel in order to recover the degree of vacuum in this vacuum vessel when the vacuum deteriorates.

In accordance with the vacuum switchgear of the present invention, since the vacuum-sensing element can be electrically separated from the main circuit, the reliability of the function for measuring or monitoring the degree of vacuum can be improved, and if the degree of vacuum deteriorates, the vacuum can be recovered by the vacuum pump, which in turn ensures the safety of the switchgear. Also, by separating the circuit-breaker portion from the disconnector portion, it is possible to prevent a malfunction which has occurred in either the circuit-breaker portion or the disconnector portion, from propagating in the whole of the switchgear. Moreover, since the degree of vacuum in the vacuum vessel containing the circuit-breaker portion can be directly monitored, the reliability of the circuit-breaker portion is improved.

Since the pair of the movable and the fixed electrodes in the circuit-breaker portion is coaxially arranged with the pair of the movable and the fixed electrodes in the disconnector portion, even if a large driving force is applied to these pairs of electrodes in a disconnecting operation, this driving force can be absorbed or alleviated by those coaxially arranged components, which in turn can improve the reliability of the vacuum switch. Further, since the vacuum vessel is surrounded by the first or second grounded vacuum vessel, even if a malfunction occurs in the vacuum vessel, the vacuum vessel can be protected from the malfunction by the first or second grounded vacuum vessel.

In accordance with the vacuum switch and the operation method of the switchgear according to the present invention, by operating the vacuum pump as the occasion arises, or at will, the degree of vacuum in not only the grounded vacuum vessels, but also the vacuum vessel containing the vacuum circuit-breaker, is improved or maintained at a necessary level, and this can remarkably improve the performances of the vacuum switch and the vacuum switchgear. switch and vacuum switchgear using the vacuum switch.

DETAILED DESCRIPTION OF THE EMBODIMENTS

In embodiments of the present invention, a vacuum switch basically includes a vacuum vessel which contains a fixed electrode and a movable electrode being connected to, and disconnected from the fixed electrode, of a circuit-breaker; a first grounded vacuum vessel which contains the vacuum vessel, being electrically insulated and communicating with the vacuum vessel; a second grounded vacuum vessel which contains a disconnector and a grounding switch, being electrically insulated from the vacuum vessel and the first grounded vacuum vessel; an insulation bushing which is projected from the first grounded vacuum vessel; a load conductor led out of a bushing projected from the second grounded vacuum vessel; a grounding conductor led out of another bushing projected from the second grounded vacuum vessel; first and second vacuum-measurement devices; a first operation rod for driving a movable blade for the movable electrode of the circuit-breaker; and a second operation rod, which is situated substantially in the direction of the axis of the first operation rod, for driving a movable blade for the movable electrode of the disconnector.

Figure 1:
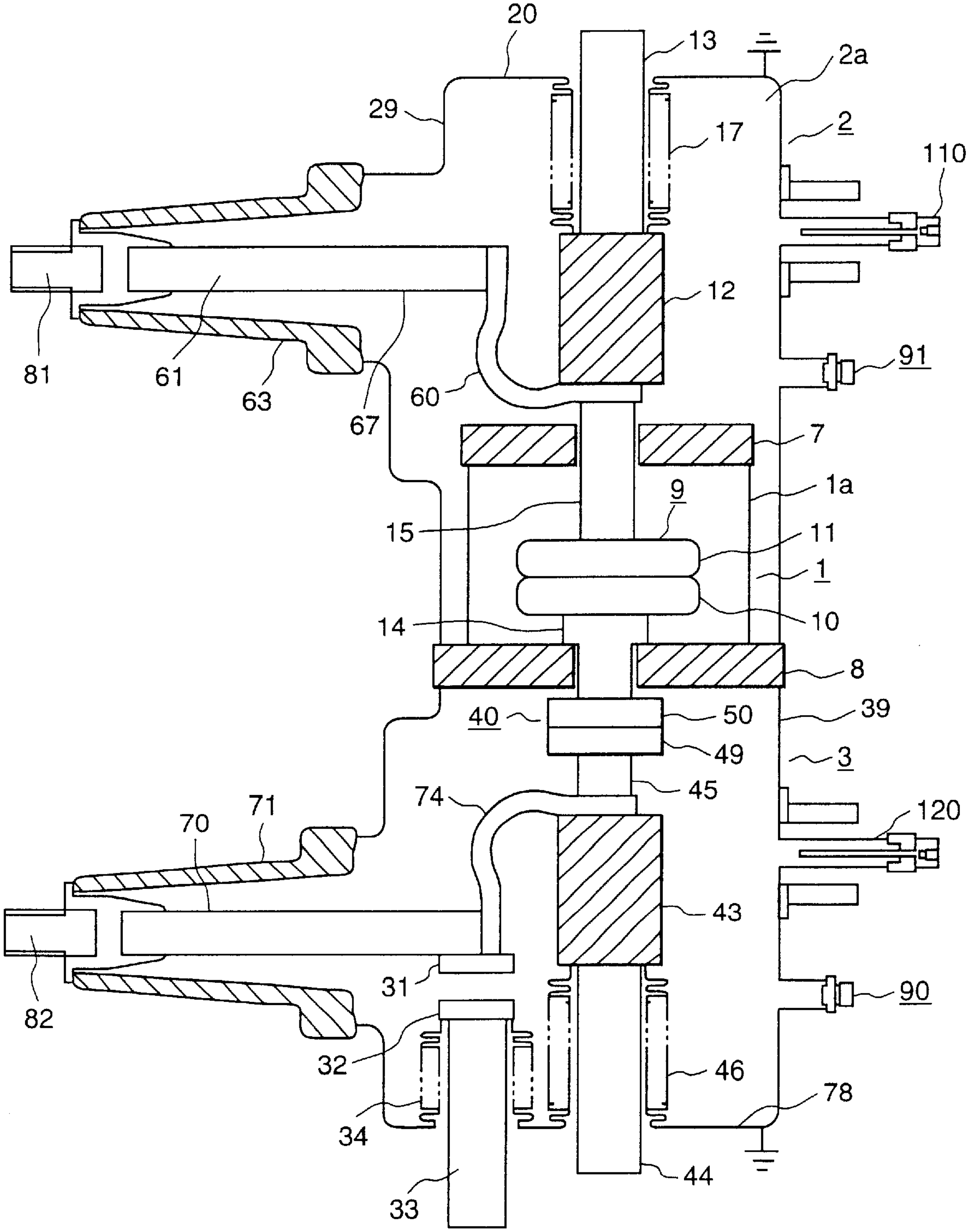
FIG. 1 is a vertical cross section of the composition of a vacuum Switch of an embodiment according to the present invention.

In the following, embodiment 1 of the present invention will be explained with reference to FIG. 1. In this figure, the vacuum switch includes the vacuum vessel 1 containing the movable electrode 11 and the fixed electrode 10 of the circuit-breaker 9; the first grounded vacuum vessel 2 containing the vacuum vessel 1; a vacuum-sensing element 110 attached to the first grounded vacuum vessel 2; a vacuum pump 91 attached to the first grounded vacuum vessel 2; and the second grounded vacuum vessel containing the disconnector 40 and the grounding switch. Most portions of the vacuum vessel 1 and the first grounded vacuum vessel 2 are made of conductive material such as a metal with high strength, for example, stainless steel. Further, the first grounded vacuum vessel 2 is grounded. The portions such as member 7 and 8, other than the conductive portions, are fabricated with insulation material such as alumina.

The vacuum vessel 1 is composed by locating the insulation member 7 and 8 on and under the side wall of the vacuum vessel 1, respectively. The fixed electrode 10 and the movable electrode 11 which is disconnectable from the fixed electrode 10, are arranged in the vacuum vessel 1, and circuit-disconnection or connection is performed by disconnecting the movable electrode 11 from the fixed electrode 10, or connecting the movable electrode 11 to the fixed electrode 10. A movable conductor 15 penetrates the insulation member 7 connected to the movable electrode 11. Since there is a narrow gap between the insulation member 7 and the movable conductor 15, which permits the movement of the movable electrode 11, the vacuum space of the vacuum vessel 1 communicates with that of the first grounded vacuum vessel 2. Therefore, the vacuum-sensing element 110 can directly measure or monitor the degree of vacuum in the vacuum vessel 1 and the first grounded vacuum vessel 2.

Another terminal of the movable conductor 15 is connected to a power source conductor 61 via a flexible conductor 60. This terminal of the movable conductor 15 is also connected to a link mechanism of an operation unit via a movable blade 13. The movable blade 13 is hermetically sealed by a bellows 17.

The first grounded vacuum vessel 2 is composed of an end plate 20 and a side wall 29, and the vacuum vessel 1 is surrounded by a vacuum space 2a. A connection part 81 is connected to a bus bar (not shown in FIG. 1).

At the side of the fixed electrode 10, there is the second grounded vacuum vessel 3 which contains a movable electrode 49 and a fixed electrode 50 of the disconnector 40, a flexible conductor 74, and movable and fixed electrodes 31 and 32 of a grounding switch. The first grounded vacuum vessel 2 is hermetically separated from an insulation member 8. Accordingly, a vacuum-sensing element 120 and a vacuum pump 90 are attached to the second grounded vacuum vessel 3, independent of the vacuum-sensing element 110 and the vacuum pump 91. A movable conductor 45 connected to the movable electrode 49 of the disconnector 40 is connected to a link mechanism of an operation unit via an insulation member 43 and a connection member 44.

The flexible conductor 74 is electrically connected to the connection part 82 via the load conductor 70.

Figure 2:
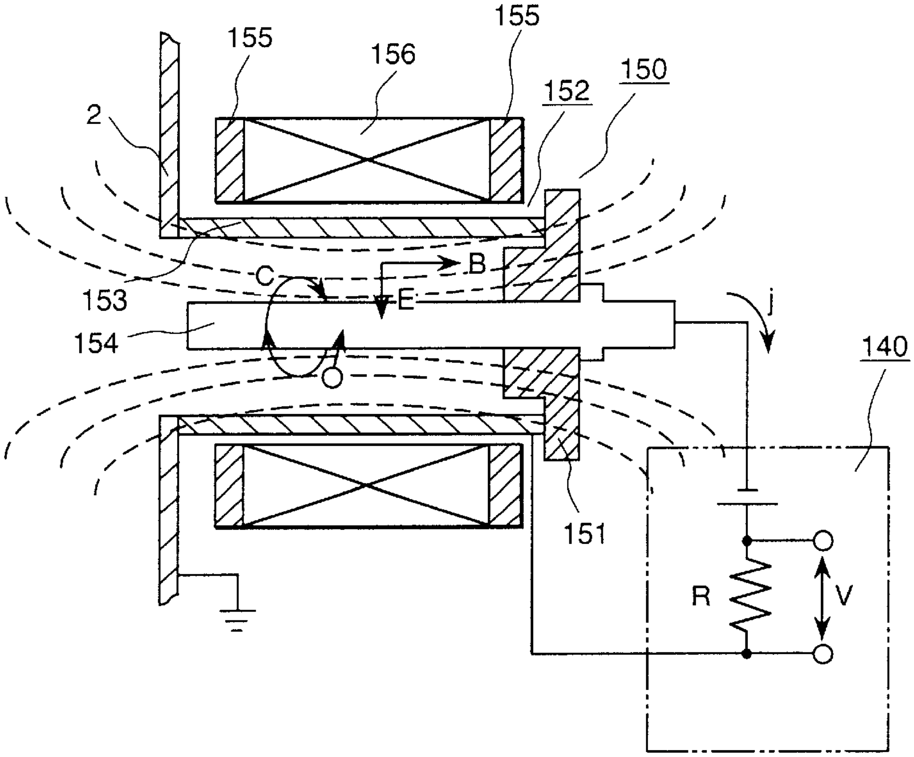
FIG. 2 is a vertical cross section of the structure of a vacuum-measurement device used for embodiments according to the present invention.

FIG. 2 shows a vertical cross section of a magnetron-type vacuum-measurement device, which is an example of a vacuum-measurement device used for the embodiments of the present invention, and a vacuum-sensing element 150 of this measurement device is attached to the side wall of the first grounded vacuum vessel 2. The vacuum-sensing element 150 is composed of a pair of coaxial electrodes 152 and a coil 156, located surrounding the coaxial electrode s 152, for generating a magnetic flux. The coaxial electrodes 152 consist of an outer cylindrical electrode 153 and an inner electrode 153 which is led inside the outer cylindrical electrode 153, and these electrodes are electrically insulated from each other. Meanwhile, it is possible to use a ring permanent magnet in place of the coil 156. Further, even if the direction of N and S polarities i s reversed, the same performance of the vacuum-sensing element can be obtained.

Figure 3:
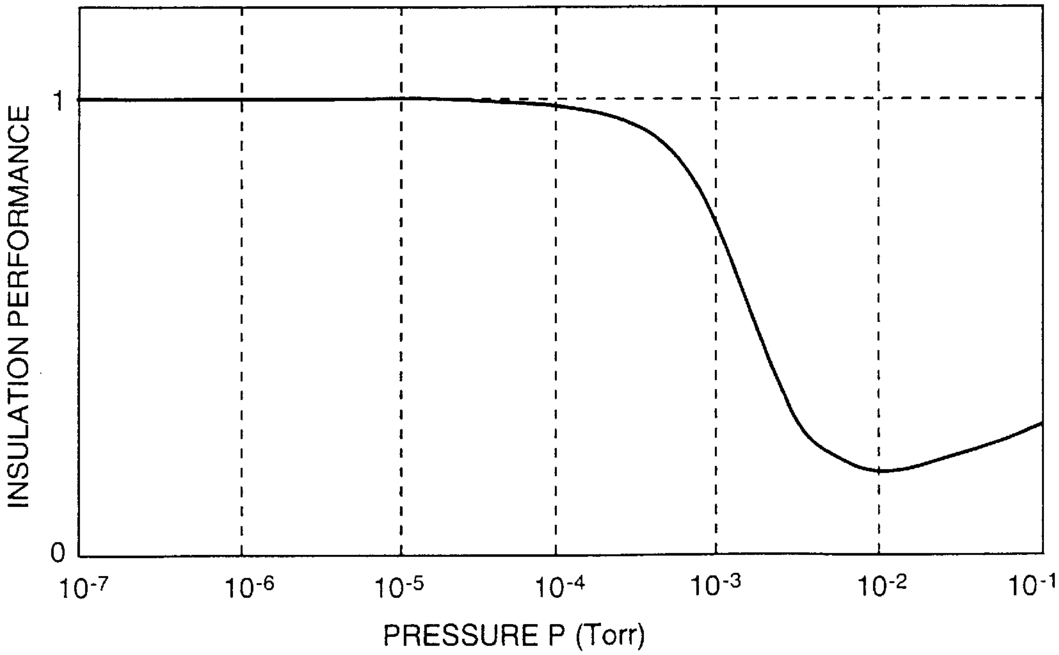
FIG. 3 is a graph indicating the relationship between the degree of vacuum and the vacuum insulation characteristics.

Next, the operation of the vacuum-sensing element 150 is explained below. The negative DC voltage is applied to the inner electrode 154 by a power source circuit 130. The AC voltage or the pulse voltage can also be used. Electrons emitted from the inner electrode 154 receive Lorentz force caused by the electric field E and the magnetic field B generated by the coil 156, and slew around the inner electrode 154. The slewing electrons collide with gas remaining in the vacuum vessel at which the element 150 is installed, and ionize this gas. Further, the generated positive ions I move to the inner electrode 154. Since this ion current j depends on the quantity of the remaining gas, that is, the pressure of this gas, this gas pressure can be measured by measuring the voltage between both terminals of a resistor R. Continuous monitoring of this gas pressure can be implemented by lighting an alarm lamp or generating an alarm, which are performed with a relay operated by the voltage V generated between both terminals of the resistor R. Here, as shown in FIG. 3, the disconnection and insulation characteristics of the circuit-breaker 9 in the vacuum vessel 1 rapidly deteriorate if the gas pressure P is more than $10^{-4}$ Torr, it is necessary to monitor the degree of vacuum in the vacuum vessel so as to prevent the degree of vacuum from decreasing to below that value (the gas pressure from increasing to over that value.) Since the above-described magnetron-type vacuum-sensing element 150 can detect about the pressure of $10^{-6}$ Torr, it is effective enough to monitor the degree of vacuum in the vacuum vessel.

Further, since the vacuum-sensing element 150 is attached to the grounded vacuum vessel 2, a power source circuit 140 of the vacuum-sensing element 150 can be separated from the main circuit of the vacuum switchgear. Accordingly, a device for isolating the vacuum-sensing element 150, for example, a transformer, is not necessary, and this makes it possible to directly connect the resistor R to a measurement circuit or a relay circuit. Thus, it has become possible to downsize and simplify the measurement system, which in turn can reduce the size of the vacuum switch. Furthermore, since an erroneous operation of the vacuum-sensing element 150 due to a surge voltage signal from the main circuit 130 does not occur, the reliability of the sensing element 150 can be improved. Moreover, since the vacuum-sensing element 150 is directly attached to the grounded metal vacuum vessel 2, the number of electrons which enter the vacuum vessel 1 is less than that in the case where the sensing element 150 is attached to the vessel 2 via an insulation cylinder, and this can prevent the insulation and shielding characteristics of the vacuum vessel 1 from deteriorating.

In addition, since the vacuum pumps 91 and 90 are attached to the grounded vacuum vessels 2 and 3, respectively, even in the unlikely event that the degree of vacuum in the vacuum vessel 1, and the first and second grounded vacuum vessels 2 or 3 deteriorates due to gas discharge from the components in these vacuum vessels, it can be detected by the vacuum-sensing element 110 or 120, for which the above vacuum-sensing element 150 is adopted, and the degree of vacuum can be recovered by operating the vacuum pump 91 or 90.

The cylindrical side wall la of the vacuum vessel 1 is made of conductive material such as stainless steel, and is fixed on the insulation member 8 made of insulation material such as ceramics. Further, the side wall la is supported by the insulation member 7. A conductor 14 penetrates the central region of the insulation member 8, and the fixed electrode 10 is connected to the end of the conductor 14 in the vacuum vessel 1. The movable electrode 11 is situated opposite to the fixed electrode 10, and these electrodes compose the circuit-breaker 9. The movable conductor 15 for driving the movable electrode 11 of the circuit-breaker 9 in the vacuum vessel 1, is connected to the flexible conductor 60, and to the movable blade 13 via the insulation member 12. The movable blade 13 is connected to an operation mechanism in an operation unit, and it drives the movable conductor 15 to reciprocate in accordance with the operation of the operation mechanism. A control device (not shown in the figures) is situated in the operation mechanism, and it generates a signal to operate the circuit-breaker 9. The connection or disconnection between the movable electrode 11 and the fixed electrode 10 is implemented by the reciprocation of the movable conductor 15, which is started by this signal.

In this way, since the vacuum vessel 1 is contained in the first grounded vacuum vessel 2, the potential of the vacuum vessel 1 is at an intermediate level between the ground level and the voltage of the main circuit, and this can prevent the insulation breakdown which may occur between the vacuum vessel 1 and the first grounded vacuum vessel 2. Further, since the insulation between the vacuum vessel 1 and the first grounded vacuum vessel 2 is maintained, even in the unlikely event that leakage occurs in the vacuum vessel 1, insulation can sill be maintained.

The first grounded vacuum vessel 2 containing the vacuum vessel 1 is arranged coaxial with the vacuum vessel 1. An end plate 20 of a convex shape in the inside and down direction of the vacuum vessel 2, is welded to the end portion of the vacuum vessel 2. Also, the vacuum-sensing element 120 for sensing the degree of vacuum in the second grounded vacuum vessel 3 is attached to the second grounded vacuum vessel. Further, the vacuum pump 90 is attached to the side wall of this vacuum vessel 3, and it is possible to recover the vacuum state by using the vacuum pump 90.

Both end sides of the bellows 17 are connected to the end plate 20 and to an end side of the insulation member 12, respectively, by which the airtight seal of the first grounded vacuum vessel 2 is maintained. Further, an end side of the flexible conductor 60 is fixed to a conductor 61. The side wall 39 of the second grounded vacuum vessel 3 is made of conductive material with high strength, for example, stainless steel. The second grounded vacuum vessel 3 is arranged coaxial with the first grounded vacuum vessel 2. The conductor 14 penetrates the insulation member 8, and is connected to the side wall 39 via the insulation member 8. Further, the fixed electrode 50 of the disconnector 40 is situated on the end side of the conductor 14 in the second grounded vacuum vessel 3. The movable electrode 49 is arranged opposite to the fixed electrode 50. The movable blade or conductor 44 is connected to the movable electrode 49 via the movable conductor 45, the attachment part of the flexible conductor 74, and the insulation member 43. Both end sides of a bellows 46 are connected to an end plate 20 and to an end side of the insulation member 43, respectively, by which the airtight seal of the second grounded vacuum vessel 3 is maintained.

The movable blade 44 is connected to an operation case containing an operation unit, via a link mechanism, and the operation unit drives the movable blade 44 to reciprocate. The connection or disconnection between the movable electrode 49 and the fixed electrode 50 is implemented by the reciprocation of the movable blade 44. By closing the circuit-breaker 9 after the disconnector 40 is closed by slowly applying force to the disconnector 40, it is possible to approximately balance the force applied to the movable electrode 11 of the circuit-breaker 9 and the force applied to the movable electrode 49 of the disconnector 40. Accordingly, the thickness of the insulation member 8 can be reduced, and its size can also be decreased.

Moreover, in the grounding switch, the movable electrode 32 is arranged opposite to the fixed electrode 31. The movable electrode 32 is connected to the movable blade or conductor 33. A bellows 34 is provided in the cylinder formed by the side wall 39. One end side of this bellows 34 is connected to the cylinder, and the other end side of the bellows 34 is connected to the movable electrode 32 via an insulation member, by which the airtight seal of the vessel 3 can be maintained. A grounding conductor (not shown in the figures) is connected to the movable blade 33, and this conductor is grounded. Also, the movable blade 33 is connected to a link (not shown in the figures), and the link is further connected to an operation unit (not shown in the Figures). The fixed electrode 31 is connected to end sides of a conductor 70 and the flexible conductor 74. The insulation member 43 is connected to the movable conductor 45 via another end side of the flexible conductor 74. Further, the end side of the flexible conductor 74 is connected to the conductor 70. The bushing 71 is provided surrounding the conductor 70. Furthermore, a load conductor is connected to the main circuit of the switchgear through an insulation part 82 situated outside the bushing 71.

The vacuum-sensing element 120 is attached to the side wall 39 of the second grounded vacuum vessel 3.

Since the vacuum switch is composed so that the first and second grounded vacuum vessels 2 and 3 are serially arranged in a line, it has become possible to provide a compact switchgear of small width. Moreover, since the respective first and second grounded vacuum vessels 2 and 3 are grounded, and the potential of their side walls is equal to the ground potential, the respective switches for three phases can contact each other, or they can be laid near each other, which in turn makes it possible to provide a compact switchgear.

The movable blade 13 is connected to the drive mechanism for driving this blade to reciprocate, and the fixed electrodes 10 and 50 of the circuit-breaker 9 and the disconnector 40 are connected to both end sides of the fixed conductor 14, respectively. Therefore, it is possible to balance the force applied to the movable electrode 11 of the circuit-breaker 9 and that of the disconnector 40, and this can reduce the thickness of the insulation member 8, and the size of the vacuum switch. Also, since the vacuum switch is composed so that the first grounded vacuum vessel 2 containing the circuit-breaker 9 is connected to the second grounded vacuum vessel 3 containing the disconnector 40 and the grounding switch, the reliability in the insulation characteristics of the vacuum switch can be improved. Moreover, since the circuit-breaker 9, the disconnector 40, and the grounding switch can be separately fabricated, the freedom in composing the switchgear is increased.

The spaces inside the respective vacuum-sensing elements 110 and 120 communicate with the spaces inside the respective first and second grounded vacuum vessels 2 and 3, and the degree of vacuum in these spaces is continuously measured or monitored. Since the vacuum pumps 90 and 91 are attached to the respective first and second grounded vacuum vessels 2 and 3, even in the unlikely event that the degree of vacuum deteriorates due to discharge of gas from parts composing the vacuum switch, it is possible to recover the degree of vacuum in these vessels by detecting the deterioration of the degree of vacuum with the vacuum-sensing elements 110 and 120, and operating the pumps 90 and 91. In this way, the safety and reliability of the vacuum switch can be improved. Thus, the present invention has remarkable advantages of monitoring the degree of vacuum in the vacuum switch and improving the performance of the vacuum switch.

In a vacuum switch, it is favorable to install a vacuum-measurement device outside a vacuum vessel containing a fixed electrode and a movable electrode of a circuit-breaker in order to prevent metal particles which are emitted from the electrodes when the electrodes are disconnected, from entering the vacuum-measurement device. Further, by using magnetic material for the attachment member of the vacuum-measurement device, the magnetic reluctance of the vacuum-measurement device can be decreased.

As an example of a vacuum-sensing element for the vacuum-measurement device, a vacuum-sensing element which includes coaxial electrodes and a magnetic field-generating element, for sensing the degree of vacuum, can be used.

Further, it is possible to provide an electrode whose potential is set equal to an external electrode, which is located opposite to the inner central electrode of the above vacuum-sensing element. In the concept of the present invention, there can be various modifications or improvements such as that indicated by the above coaxial electrode composed of a cup-type ceramic cylinder whose inside surface is plated with metal, and the inner central electrode penetrating the base of the ceramic cylinder.

Figure 4:
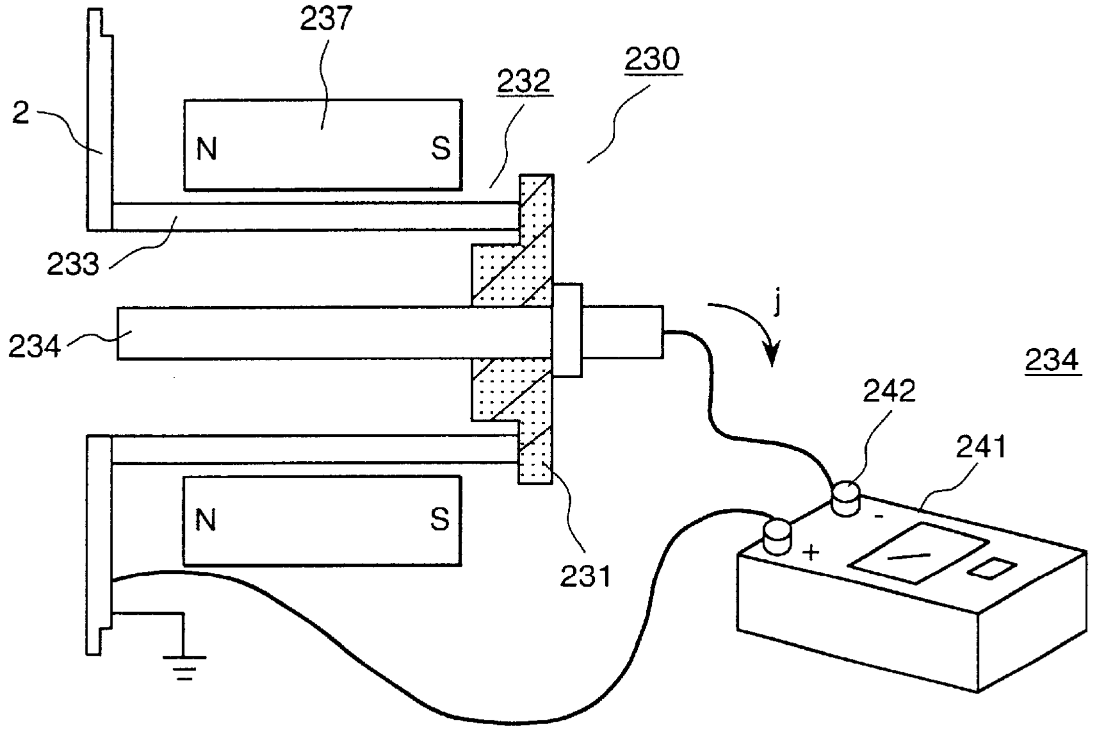
FIG. 4 is a schematic diagram of the composition of a vacuum-measurement device of another embodiment according to the present invention.

Furthermore, a megger can be used as the power source of the vacuum-sensing element. FIG. 4 shows a schematic diagram of the composition of the vacuum-measurement device to which a megger is used for a power source. The vacuum-sensing element of the vacuum-measurement device 230 is attached to the grounded vacuum vessel 2. The vacuum-sensing element includes the inner electrode 233 and the outer electrode 234 located surrounding the electrode 233, and both electrodes are insulated from each other by the insulation member 231. A pair of permanent magnets 237 are arranged outside the outer electrodes 233. When measuring the degree of vacuum, the measurement is carried out by connecting the terminal of the megger 243 to the inner electrode 234 and the vacuum vessel 2, wherein the megger is used as the power source. In this embodiment, since an independent power source is not necessary, the measurement device can be simplified, and is safe.

As described above, in accordance with the present invention, it has become possible to improve the reliability of measuring and monitoring the degree of vacuum in a vacuum switch, and consequently to provide a highly safe vacuum switch and switchgear.

What is claimed is:

1. A vacuum switch having a circuit breaker and a disconnector operable to disconnect the vacuum switch upon opening of the circuit breaker, the vacuum switch comprising:

a first grounded vacuum vessel defining a first vacuum space in which the circuit-breaker is contained;

a second grounded vacuum vessel defining a second vacuum space, different from the first vacuum space, in which the disconnector is contained;

a first vacuum-measurement device which is attached to said first grounded vacuum vessel; and a second vacuum measurement device which is attached to said second grounded vacuum vessel.

2. A vacuum switch according to claim 1, further comprising a third grounded vacuum vessel containing said first grounded vacuum vessel, wherein the first vacuum space communicates with a third vacuum space in said third grounded vacuum vessel; and the second vacuum space is separated from the third vacuum space.

3. A method of operating a vacuum switch, which includes a vacuum circuit-breaker and a disconnector, contained in different respective vacuum spaces in corresponding different grounded vacuum vessels, including a vacuum-measurement device and a vacuum pump attached to each grounded vacuum vessel; wherein, when the degree of vacuum in at least one of said grounded vacuum vessels deteriorates to less than a predetermined degree, the degree of vacuum in a corresponding one of a vacuum vessel containing said vacuum circuit-breaker and said grounded vacuum vessels, is increased by operating said vacuum pump of said corresponding vessel.

4. A method of operating a vacuum switch, which includes a vacuum circuit-breaker and a disconnector, contained in different respective vacuum spaces in corresponding different rounded vacuum vessels, including a vacuum-measurement device and a vacuum pump attached to each grounded vacuum vessel; wherein the degree of vacuum in said vacuum switch is continuously monitored, and when it is necessary that the degree of vacuum in at least one of said grounded vacuum vessels is increased, the degree of vacuum in a corresponding one of a vacuum vessel containing said vacuum circuit-breaker and said grounded vacuum vessels, is increased by operating said vacuum pump of said corresponding vessel.

5. A method of operating a vacuum switch, which includes a vacuum circuit-breaker and a disconnector, contained in different respective vacuum spaces in corresponding different grounded vacuum vessels, including a vacuum-measurement device and a vacuum pump attached to each grounded vacuum vessel; wherein the degree of vacuum in a vacuum switchgear including said vacuum switch and operation units for driving respective movable electrodes of said vacuum switch, is continuously monitored, and when it is necessary that the degree of vacuum in at least one of said grounded vacuum vessels is increased, the degree of vacuum in a corresponding one of a vacuum vessel containing said vacuum circuit-breaker and said grounded vacuum vessels, is increased by operating said vacuum pump of said corresponding vessel.

* * * * *